(12) United States Patent
Shimazaki et al.

(10) Patent No.: US 7,278,124 B2
(45) Date of Patent: Oct. 2, 2007

(54) DESIGN METHOD FOR SEMICONDUCTOR INTEGRATED CIRCUIT SUPPRESSING POWER SUPPLY NOISE

(75) Inventors: Kenji Shimazaki, Kobe (JP); Kazuhiro Sato, Neyagawa (JP); Takahiro Ichinomiya, Katano (JP); Shozo Hirano, Osaka (JP); Masao Takahashi, Takatsuki (JP); Hiroyuki Tsujikawa, Kusatsu (JP); Seijiro Kojima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 302 days.

(21) Appl. No.: 11/024,470

(22) Filed: Dec. 30, 2004

(65) Prior Publication Data

US 2005/0149894 A1 Jul. 7, 2005

(30) Foreign Application Priority Data

Jan. 6, 2004 (JP) ............................. 2004-001347

(51) Int. Cl.
*G06F 17/50* (2006.01)
(52) U.S. Cl. .................................. 716/5; 716/1; 716/2
(58) Field of Classification Search .................... 716/5, 716/2, 1
See application file for complete search history.

(56) References Cited

U.S. PATENT DOCUMENTS

| | | | | |
|---|---|---|---|---|
| 3,683,271 A | * | 8/1972 | Kobayashi | ................... 323/355 |
| 4,135,590 A | * | 1/1979 | Gaulder | ....................... 381/94.3 |
| 6,040,610 A | * | 3/2000 | Noguchi et al. | ............ 257/392 |
| 6,523,150 B1 | | 2/2003 | Buffet et al. | |
| 6,532,439 B2 | * | 3/2003 | Anderson et al. | ............. 703/14 |
| 6,754,598 B2 | | 6/2004 | Shimazaki et al. | |
| 7,015,774 B2 | * | 3/2006 | Terakawa et al. | ........... 333/181 |
| 2002/0011885 A1 | | 1/2002 | Ogawa et al. | |

(Continued)

FOREIGN PATENT DOCUMENTS

EP        1107139        6/2001

(Continued)

OTHER PUBLICATIONS

Japanese Office Action issued in corresponding Japanese Patent Application No. JP 2004-001347, dated Apr. 18, 2007.

(Continued)

*Primary Examiner*—Sun James Lin
(74) *Attorney, Agent, or Firm*—McDermott Will & Emery LLP

(57) ABSTRACT

An impedance of a power supply wire is calculated based on design data of a semiconductor integrated circuit, a frequency characteristic of the calculated impedance is obtained, and a design of the semiconductor integrated circuit is changed based on the obtained frequency characteristic. As the above-described impedance, an impedance between power supplies that are different in potential such as a power supply and a ground may be calculated, or an impedance between power supplies that are substantially the same in potential such as a power supply and an N-well power supply may be calculated. By a design modification, a wiring method, the number of pads, separation of power supplies, a type of package, a characteristic of an inductance element, a substrate structure, a distance between wires, a decoupling capacitance, a length of a wire, and a characteristic of a resistance element, for example, are changed.

22 Claims, 10 Drawing Sheets

U.S. PATENT DOCUMENTS

| | | | |
|---|---|---|---|
| 2002/0147553 A1 | 10/2002 | Shimazaki et al. | |
| 2002/0147555 A1 | 10/2002 | Nagata et al. | |
| 2003/0057966 A1 | 3/2003 | Shimazaki et al. | |
| 2003/0058060 A1* | 3/2003 | Yamamoto | 333/32 |
| 2005/0156663 A1* | 7/2005 | Shinichi | 330/149 |
| 2006/0220772 A1* | 10/2006 | Suzuki et al. | 336/69 |

FOREIGN PATENT DOCUMENTS

| | | |
|---|---|---|
| JP | 2001-175702 | 6/2001 |
| JP | 2001-202400 | 7/2001 |
| JP | A-2001-222573 | 8/2001 |
| JP | 2003-030273 | 1/2003 |
| JP | 2003-086699 | 3/2003 |
| JP | 2003-114253 | 4/2003 |
| JP | 2003-243521 | 8/2003 |
| JP | 2003-396214 | 11/2003 |

OTHER PUBLICATIONS

Ogawa et al., "A New Model of LSI at Power Supply Terminal for EMI Simulation," EMC Engineering Center, Device Analysis Technology Labs, NEC Corporation, Japan.

* cited by examiner

DESIGN METHOD FOR SEMICONDUCTOR INTEGRATED CIRCUIT SUPPRESSING POWER SUPPLY NOISE

BACKGROUND OF THE INVENTION

1. Field of the Invention

The present invention relates to a design method for a semiconductor integrated circuit, and more particularly to a design method for a semiconductor integrated circuit which suppresses power supply noise occurring in a power supply wire.

2. Description of the Background Art

In order to achieve high-speed operation and low power consumption at the same time, semiconductor integrated circuits of recent years adopt a method for controlling a source power supply (ADD) of a P-channel transistor and a substrate power supply (N-well power supply VSUBN) by separate power supplies, or a method for controlling a source power supply (VSS) of an N-channel transistor and a substrate power supply (P-substrate power supply VSUBP) by separate power supplies. Note that "substrate voltage" as described herein refers to a potential which confronts a potential of a gate, which controls the amount of electric charge in a channel of a transistor, and refers to a well voltage in the case of a transistor provided within a well.

FIGS. 12A and 12B are diagrams each showing the structure of a CMOS inverter in which an additional power supply is used to control voltage of a circuit substrate. As shown in FIG. 12A, the above CMOS inverter comprises a P-channel transistor 91 and an N-channel transistor 92. These two transistors each have, in addition to three terminals (i.e., source, drain, and gate terminals), a substrate terminal as a fourth terminal. The drain terminals of the two transistors are connected to each other. The source terminal of the P-channel transistor 91 and the source terminal of the N-channel transistor 92 are connected respectively to a power supply ADD and a ground VSS. The substrate terminal of the P-channel transistor 91 is connected to an N-well power supply VSUBN, and the substrate terminal of the N-channel transistor 92 is connected to a P-substrate power supply VSUBP.

FIG. 12B is a diagram showing a cross-sectional structure of the CMOS inverter. As shown in FIG. 12B, an N-well 94 is provided on one surface of a substrate 93, and the P-channel transistor 91 and the N-channel transistor 92 are provided respectively within the N-well 94 and on the substrate 93. In addition, in the N-well 94, a well contact 95 is provided as the substrate terminal of the P-channel transistor 91, whereas on the substrate 93, a substrate contact 96 is provided as the substrate terminal of the N-channel transistor 92. In many conventional semiconductor integrated circuits, a common power supply is used as the power supply ADD and the N-well power supply VSUBN. In semiconductor integrated circuits of recent years, however, separate power supplies which are substantially the same but different in potential are often used as the power supply ADD and the N-well power supply VSUBN, in order to achieve high-speed operation and low power consumption at the same time. Transistors that operate at high speed usually have a triple-well structure, but for simplification of explanation, a transistor having a twin-well structure is described here.

FIGS. 13A to 13C are graphs each showing the results obtained by measuring power supply noise occurring in the power supply ADD and the N-well power supply VSUBN of the semiconductor integrated circuit in which an additional power supply is used to control voltage of the circuit substrate. The graphs of FIGS. 13A to 13C show how potentials of the power supply ADD (solid lines) and the N-well power supply VSUBN (dashed lines) fluctuate at clock signal frequencies of 50 MHz, 100 MHz, and 200 MHz. From the measurement results shown in FIGS. 13A to 13C, it is apparent that a relative relationship between power supply noise (i.e., potential fluctuation) of the power supply ADD and that of the N-well power supply VSUBN varies with the clock signal frequency in a nonlinear manner. For example, in the case where the clock signal frequency is 100 MHz, the power supply noise of the N-well power supply VSUBN fluctuates more sharply than can be expected from the measurement results obtained in the cases where the clock signal frequencies are 50 MHz and 200 MHz. This is because the impedance of a path including a power supply wire separated by a resistance element, a substrate resistance, and a capacitive element, etc., is minimized when the clock frequency is around 100 MHz (i.e., a resonance frequency is around 100 MHz).

If the power supply noise varies with the clock signal frequency in a nonlinear manner as described above, the operating frequency of the semiconductor integrated circuit and a frequency at which the power supply noise increases might overlap one another. If the semiconductor integrated circuit is caused to operate at such a frequency, power supply noise might increase to change the threshold voltage and operating current of a transistor, so that a delay value and an output potential of the transistor are changed, resulting in malfunction of the transistor. Further, in semiconductor integrated circuits of recent years, with the progress of a fine process technology, it is required to lower power supply voltage. Also, the amount of current flowing through a circuit is increased with the number of transistors. Because of the above reasons, in the semiconductor integrated circuits of recent years, the design margin in relation to power supply fluctuation tends to be insufficient.

However, with conventional transistor-level circuit simulation or substrate noise simulation, it is impossible to analyze power supply noise of a semiconductor integrated circuit in which an additional power supply is used to control voltage of the circuit substrate. Therefore, the applicant of the present application has invented a new method for analyzing power supply noise of a semiconductor integrated circuit which is applicable to the above described semiconductor integrated circuit in which an additional power supply is used to control voltage of the circuit substrate, and filed a patent application (Japanese Patent Application No. 2003-396214) for the above analyzing method.

The following techniques have been known as other conventional techniques relating to the present invention. In U.S. Pat. No. 6,523,150, a method for suppressing IR-Drop (power supply voltage drop), which is a type of power supply noise, is disclosed. In this method, power supply pads are optimally assigned to each region in the semiconductor integrated circuit, and the impedance of a path from the power supply pad to an internal device of the semiconductor integrated circuit is adjusted.

Also, in Japanese Laid-Open Patent Publication No. 2001-202400, a method for suppressing EMI (Electro Magnetic Interference) noise, which is a type of power supply noise, is disclosed. In this method, a decoupling capacitor is inserted between a power supply wire and a ground wire in order to provide a path (low-pass filter) for cutting a high-frequency component. By inserting the decoupling capacitor, the impedance of the power supply wire is adjusted.

However, in the above-described methods, an impedance of a path including a power supply wire separated by a resistance element, a substrate resistance, and a capacitive element, etc., is not adjusted, and a resonance frequency is not controlled. Thus, by the above-described conventional methods, it is impossible to suppress power supply noise by taking into account a frequency characteristic of power supply noise.

SUMMARY OF THE INVENTION

Therefore, an object of the present invention is to provide a design method for designing a semiconductor integrated circuit which suppresses power supply noise by taking into account a frequency characteristic of power supply noise.

The present invention has the following features to attain the object mentioned above.

A design method for a semiconductor integrated circuit of the present invention comprises the steps of: calculating an impedance of a power supply wire based on design data of the semiconductor integrated circuit; analyzing the calculated impedance to obtain a frequency characteristic of power supply noise; and modifying a design of the semiconductor integrated circuit based on the obtained frequency characteristic.

Preferably, the impedance calculating step calculates an impedance of a path including two or more power supply wires of the semiconductor integrated circuit.

The impedance calculating step may calculate an impedance of a path including two or more power supply wires that are separated by any of a resistance element, a substrate resistance, an inductance, a capacitive element, a diffusion capacitance, and a well capacitance, such that different potentials are (or the same potential is) applied thereto. Also, the impedance calculation step may calculate an impedance including an impedance of a package connected to two or more power supply wires, or an impedance including an impedance of a printed circuit board connected to two or more power supply wires. Note that the above-described power supply wires include a grand wire provided with a potential around 0V, a power supply wire provided with a potential higher (or lower) than that of the grand wire, and a power supply wire which is connected to a well or a substrate by a body bias technique and is provided with a variable potential.

The design modification step may change a wiring method used for connecting a chip to a package, the number of pads, or separation of power supplies of the power supply wire of the semiconductor integrated circuit, a type of package of the semiconductor integrated circuit, a characteristic of an inductance element or a resistance element existing on the path including two or more power supply wires, a substrate structure of the semiconductor integrated circuit (including a substrate material or changing doping density), a distance between two or more power supply wires, a characteristic of a decoupling capacitance existing between two or more power supply wires, or a length or a width of the power supply wire of the semiconductor integrated circuit. The design modification step may provide an additional inductance element or an additional resistance element on the path including two or more power supply wires, or provide an additional decoupling capacitance between two or more power supply wires.

Also, the design modification step may change a design of the semiconductor integrated circuit based on the obtained frequency characteristic and a predetermined frequency band of the semiconductor integrated circuit. More preferably, the design modification step may change a design of the semiconductor integrated circuit in a case where a frequency at which power supply noise is maximized is included in the frequency band, or in a case where a frequency band at which power supply noise is equal to or greater than a predetermined value overlaps the frequency band. The frequency band may be an operating frequency band of the semiconductor integrated circuit, or may be determined based on a consumption current or a voltage drop value of the semiconductor integrated circuit.

Also, the impedance calculating step may calculate a plurality of impedances of the path including two or more power supply wires, the analyzing step may analyze the plurality of calculated impedances to obtain a plurality of frequency characteristics of power supply noise, and the design modification step may change a design of the semiconductor integrated circuit based on the plurality of calculated frequency characteristics. More preferably, the design modification step may change a design of the semiconductor integrated circuit such that the plurality of calculated frequency characteristics coincide with each other (or the plurality of calculated frequency characteristics are shifted from each other).

According to the design method for a semiconductor integrated circuit of the present invention, by making a design modification in view of a frequency characteristic of power supply noise, it is possible to design a semiconductor integrated circuit suppressing power supply noise. Also, the design method according to the present invention can be performed at an early stage after floor planning or layout process, whereby it is possible to select an optimum design modification from among various design modifications that are selectable at that stage, and perform the selected design modification.

Also, by calculating an impedance between power supply wires that are different in potential, it is possible to make a design modification in view of power supply noise occurring between a power supply and a ground, for example. Furthermore, by calculating an impedance between power supply wires that are the same in potential, it is possible to make a design modification, for example, in view of power supply noise occurring between a power supply and a substrate power supply or a ground and a substrate ground of a semiconductor integrated circuit controlling a voltage of a circuit substrate by using an additional power supply. Still further, by calculating an impedance including an impedance of a package or a printed circuit board, it is possible to make a design modification in view of power supply noise of a semiconductor integrated circuit under the actual operating environment.

Also, by changing a wiring method, the number of pads, or separation of power supplies, a type of package, a characteristic of an inductance element, a substrate structure, a distance between wires, a characteristic of a decoupling capacitance, a length or a width of a wire, or a characteristic of a resistance element, and providing an additional inductance element, decoupling capacitance, or resistance element, it is possible to change an inductance component, a capacitance component, and a resistance component included in an impedance of a power supply wire of a semiconductor integrated circuit, and design a semiconductor integrated circuit suppressing power supply noise.

Also, by making a design modification in view of an operating frequency band, it is possible to make a design modification in view of power supply noise occurring under the conditions in which a semiconductor integrated circuit is actually used. Furthermore, by making a design modification in view of a frequency band that is determined based on a consumption current or a voltage drop value, it is possible to make a design modification in view of power supply noise in a frequency band in which a consumption current or a voltage drop value is increased.

Also, by making a design modification based on a plurality of frequency characteristics, it is possible to design a semiconductor integrated circuit suppressing power supply noise as a semiconductor integrated circuit controlling a voltage of a circuit substrate by using an additional power supply or a semiconductor integrated circuit to which power supply voltages of a plurality of systems are supplied.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
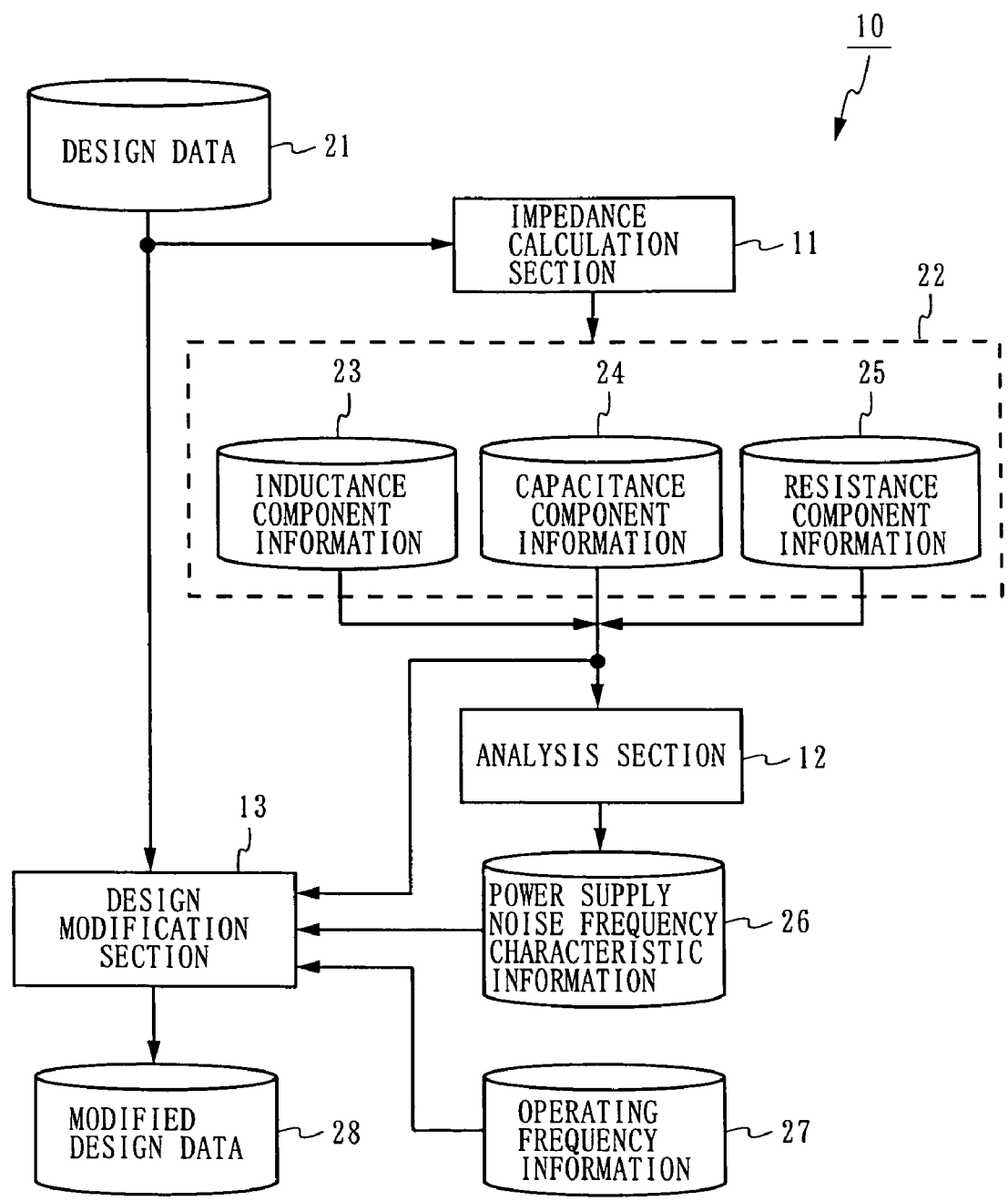
FIG. 1 is a block diagram showing the structure of a design apparatus executing a design method for a semiconductor integrated circuit according to an embodiment of the present invention.

FIG. 1 is a block diagram showing the structure of a design apparatus executing a design method for a semiconductor integrated circuit according to an embodiment of the present invention. The design apparatus 10 as shown in FIG. 1 includes an impedance calculation section 11, an analysis section 12, and a design modification section 13. Design data 21 and operating frequency information 27 are inputted to the design apparatus 10.

Roughly speaking, the design apparatus 10 operates as follows. The design data 21 is design data of a semiconductor integrated circuit to be designed (hereinafter, referred to as a target circuit). The operating frequency information 27 indicates a frequency band at which the target circuit operates. The operating frequency information 27 is designated as 200±30 MHz, for example. The impedance calculation section 11 calculates an impedance of the power supply wire of the target circuit based on the design data 21, and outputs the calculation result as impedance information 22. The impedance information 22 includes inductance component information 23, capacitance component information 24, and resistance component information 25. The analysis section 12 obtains a frequency characteristic of the impedance of the power supply wire based on the impedance information 22, and outputs the result as power supply noise frequency characteristic information 26. The design modification section 13 makes a design modification to the target circuit based on the impedance information 22, the power supply noise frequency characteristic information 26, and the operating frequency information 27. As a result of the design modification made by the design modification section 13, the design data 21 is changed to modified design data 28. In the semiconductor integrated circuit manufactured in accordance with the resultant modified design data 28, power supply noise is lower than that of the semiconductor integrated circuit manufactured in accordance with the design data 21.

Hereinafter, the details of the design apparatus 10 will be described. The design data 21 includes the following information regarding the target circuit after floor planning or layout process: information regarding the structure of the power supply wire (e.g., coordinate data of the power supply wire represented as a three-dimensional structure) and information regarding the substrate structure (e.g., coordinates of a substrate contact and a well contact, size and coordinates of a well, and size and coordinates of a diffused layer of a source terminal). Also, the design data 21 includes technology information of the power supply wire (e.g., resistance density of the power supply wire and dielectric constants of the materials between the wires), technology information of the substrate (e.g., resistance density and PN junction capacitance of the substrate and well), and package impedance information (values of resistance, capacitance and inductance of a package, which have been analyzed based on the structure of the package, by utilizing, for example, an electromagnetic field simulator).

As described above, the impedance calculation section 11 calculates the impedance of the power supply wire of the target circuit based on the design data 21. At this time, the impedance calculation section 11 calculates the impedance of the power supply wire of the target circuit in accordance with a previously determined circuit model.

Figure 2:
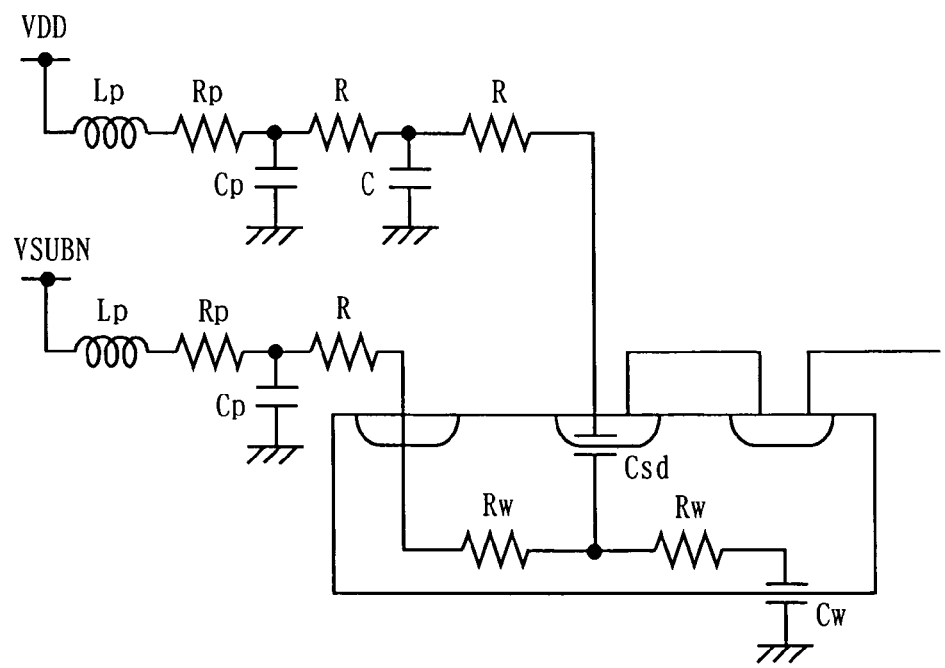
FIG. 2 is an illustration showing a first circuit model used in the apparatus as shown in FIG. 1.

FIG. 2 is an illustration showing a first circuit model used in the impedance calculation section 11. The circuit model as shown in FIG. 2 is used for calculating an impedance of a path including a high-potential wire for supplying a power supply ADD and a substrate high-potential wire for supplying an N-well power supply VSUBN having the same potential as that of the power supply ADD. This circuit model is characterized by including inductances Lp of a package connected to the two power supply wires and a source/drain capacitance (also called a diffusion capacitance) Csd. With the first circuit model, it is possible to calculate an impedance of a path including a series circuit of the inductances Lp and the source/drain capacitance Csd.

Figure 3:
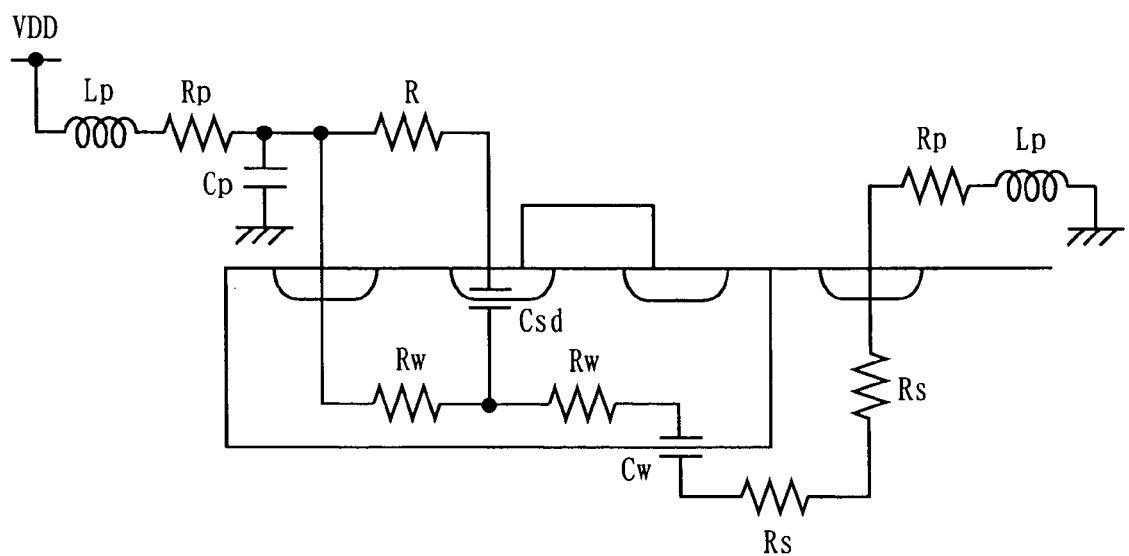
FIG. 3 is an illustration showing a second circuit model used in the apparatus as shown in FIG. 1.

FIG. 3 is an illustration showing a second circuit model used in the impedance calculation section 11. The circuit model as shown in FIG. 3 is used for calculating an impedance of a path including a high-potential wire for supplying a power supply ADD and a ground wire for supplying a ground VSS. This circuit model is characterized by including inductances Lp of a package connected to the two power supply wires and a well capacitance Cw. With the second circuit model, it is possible to calculate an impedance of a path including a series circuit of the inductances Lp and the well capacitance Cw.

Figure 4:
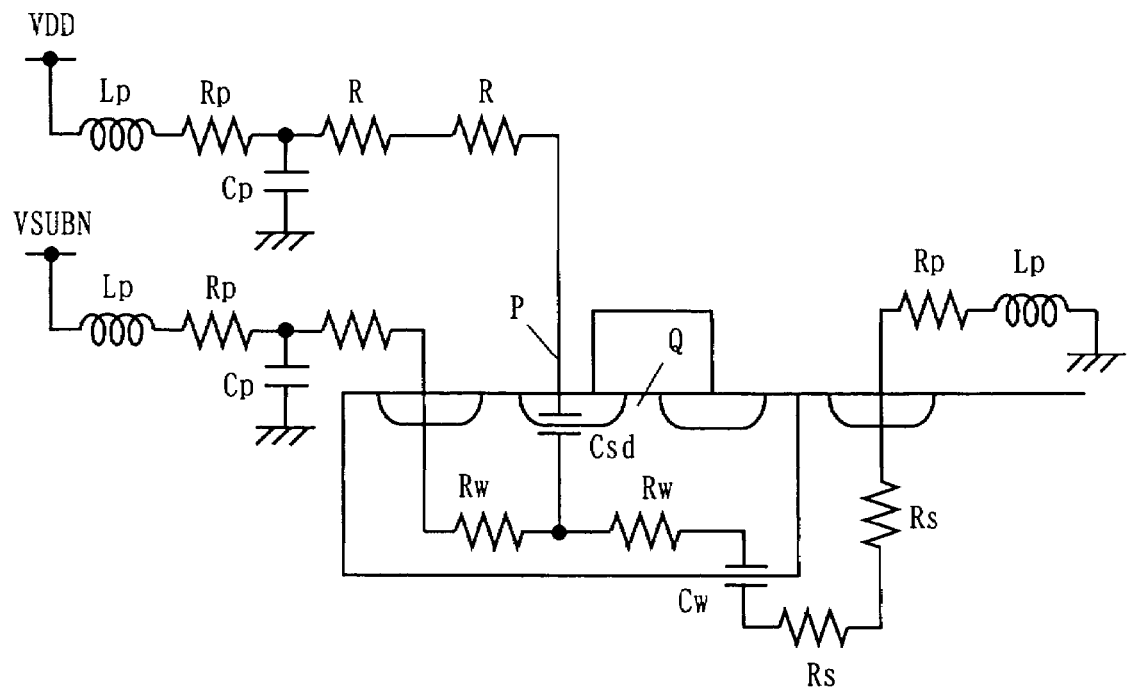
FIG. 4 is an illustration showing a third circuit model used in the apparatus as shown in FIG. 1.

FIG. 4 is an illustration showing a third circuit model used in the impedance calculation section 11. The circuit model as shown in FIG. 4 is used for calculating an impedance between a plurality of power supplies. This circuit model includes a high-potential wire for supplying a power supply VDD, a substrate high-potential wire for supplying an N-well power supply VSUBN, and a ground wire for supplying a ground VSS. In this circuit model, an inductance Lp of a package connected to the two power supply wires and a capacitance (source/drain capacitance Csd or well capacitance Cw) are included in a path including the high-potential wire and the substrate high-potential wire, a path including the high-potential wire and the ground wire, and a path including the ground wire and the substrate high-potential wire. With the third circuit model, it is possible to calculate an impedance between a plurality of power supplies including a series circuit of an inductance and a capacitance.

Note that, irrespective of which circuit model is used, instead of or in addition to the inductances Lp of the package, an impedance of a printed circuit board on which the target circuit is mounted may be used. Also, an impedance of an element which is placed close to a chip on the printed circuit board may be taken into consideration.

Also, instead of calculating the impedance of the path including two or more power supply wires separated by a substrate resistance or a well capacitance, the impedance calculation section 11 may calculate an impedance of a path including two or more power supply wires separated by a resistance element or a capacitive element. Some analog semiconductor integrated circuits include two or more power supply wires separated by a resistance element, and some semiconductor integrated circuits include two or more power supply wires separated by a capacitive element such as a coupling capacitance. Also in the cases of the above semiconductors, the impedance calculation section 11 may calculate an impedance of a path including two or more power supply wires using a circuit model that has characteristics similar to those of the circuit models as shown in FIGS. 2 to 4. As such, by calculating an impedance between power supply wires separated by any of a resistance element, a substrate resistance, an inductance, a capacitive element, a diffusion capacitance, and a well capacitance, it is possible to design various target circuits, including analog circuits, as circuits suppressing power supply noise.

Figure 5:
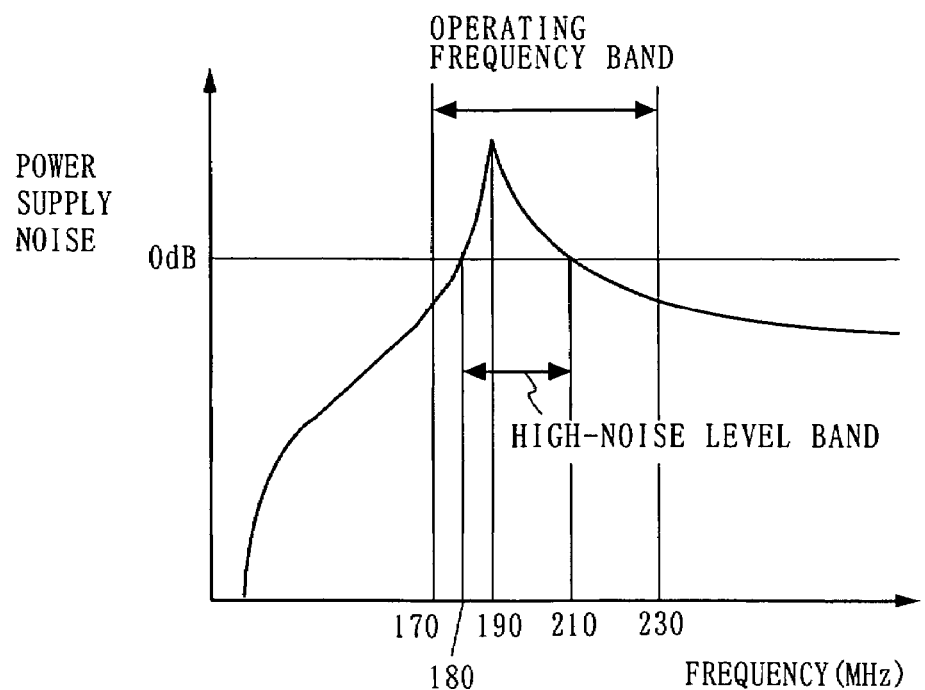
FIG. 5 is a graph showing a frequency characteristic of power supply noise obtained by the apparatus as shown in FIG. 1.

As described above, the analysis section 12 obtains a frequency characteristic of the impedance of the power supply wire, and the design modification section 13 makes a design modification to the target circuit. Hereinafter, with reference to FIGS. 5 to 7 and FIGS. 8A and 8B, a design modification made to the target circuit based on a frequency characteristic of the impedance of the power supply wire will be described. FIG. 5 is a graph showing a frequency characteristic, which was obtained by the analysis section 12, of power supply noise between a power supply VDD and a ground VSS of a particular target circuit. In FIG. 5, the horizontal axis represents frequency, and the vertical axis represents the level of power supply noise. In this embodiment, a range of frequencies where the level of power supply noise is equal to or greater than 0 dB is distinguished from a range of frequencies where the level of power supply noise is less than 0 dB, and the former range is referred to as a high-noise level band. Also, a frequency at which the level of power supply noise becomes highest is referred to as a resonance frequency. In the frequency characteristic as shown in FIG. 5, a high-noise level band is a range of frequencies from 180 MHz to 210 MHz, and a resonance frequency is 190 MHz. Also, assume that an impedance of the power supply wire of the target circuit includes a power supply wire inductance of 5 nH (nanohenry) and a power supply wire capacitance of 20 nF (nanofarad), and an operating frequency band of the target circuit is a range of frequencies from 170 MHz to 230 MHz.

In the case where the operating frequency band does not overlap the high-noise level band, power supply noise in the operating frequency band is relatively low. Therefore, it is not necessary to make a design modification to the target circuit in order to suppress power supply noise. On the other hand, as shown in FIG. 5, in the case where the operating frequency band overlaps the high-noise level band, power supply noise becomes relatively high within the overlapping band. Therefore, a design modification has to be made to the target circuit in order to suppress power supply noise. There are various approaches to suppressing a power supply noise characteristic of the target circuit. For example, a design modification may be made in order to shift the resonance frequency to a frequency lower or higher than the operating frequency band. Alternatively, a design modification may be made in order to shift the high-noise level band so as not to overlap the operating frequency band.

Figure 6:
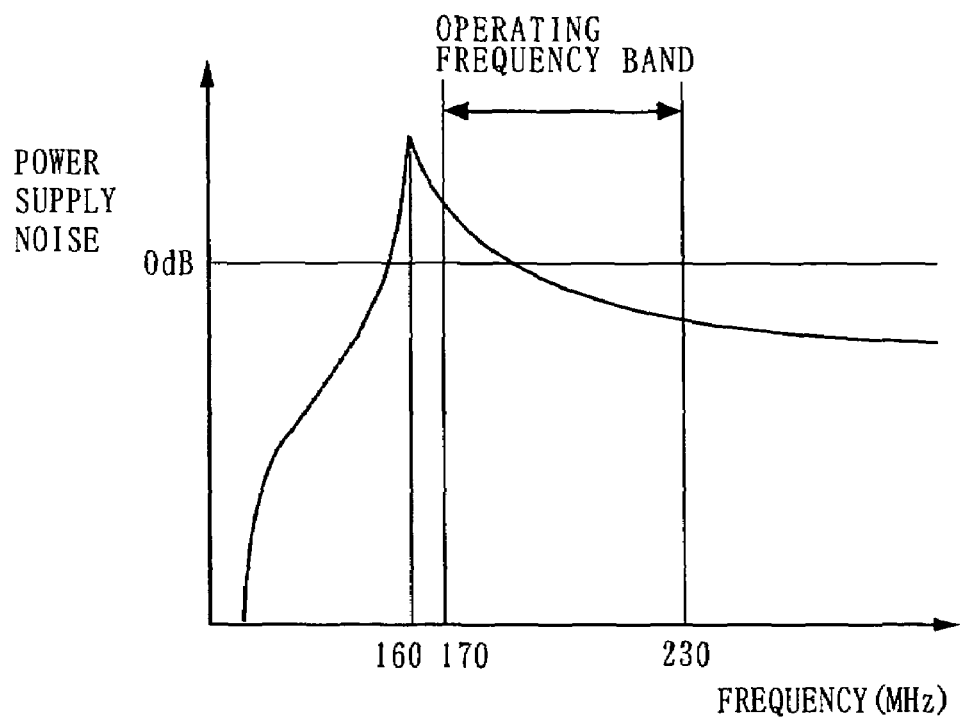
FIG. 6 is a graph showing a frequency characteristic in the case where the resonance frequency is shifted to a frequency lower than an operating frequency band in the apparatus as shown in FIG. 1.

FIG. 6 is a graph showing a frequency characteristic in the case where the resonance frequency is shifted to a frequency lower than the operating frequency band. Such a shift of the resonance frequency is performed in the case where the resonance frequency is included in the operating frequency band. In the frequency characteristic as shown in FIG. 6, the resonance frequency is 160 MHz, which is lower than the operating frequency band (170 MHz to 230 MHz). In order to shift the resonance frequency from 190 MHz to 160 MHz, the power supply wire inductance and/or the power supply wire capacitance should be increased. For example, only the power supply wire inductance may be increased from 5 nH to 7 nH, or only the power supply wire capacitance may be increased from 20 nF to 30 nF. Alternatively, the power supply wire inductance and the power supply wire capacitance may be increased from 5 nH to 6 nH and from 20 nF to 25 nF, respectively. As described above, by making a particular modification to a component element of the target circuit, it is possible to shift the resonance frequency to 160 MHz, which is lower than the operating frequency band. As a result, it is possible to suppress power supply noise in the operating frequency band to less than a predetermined level.

Figure 7:
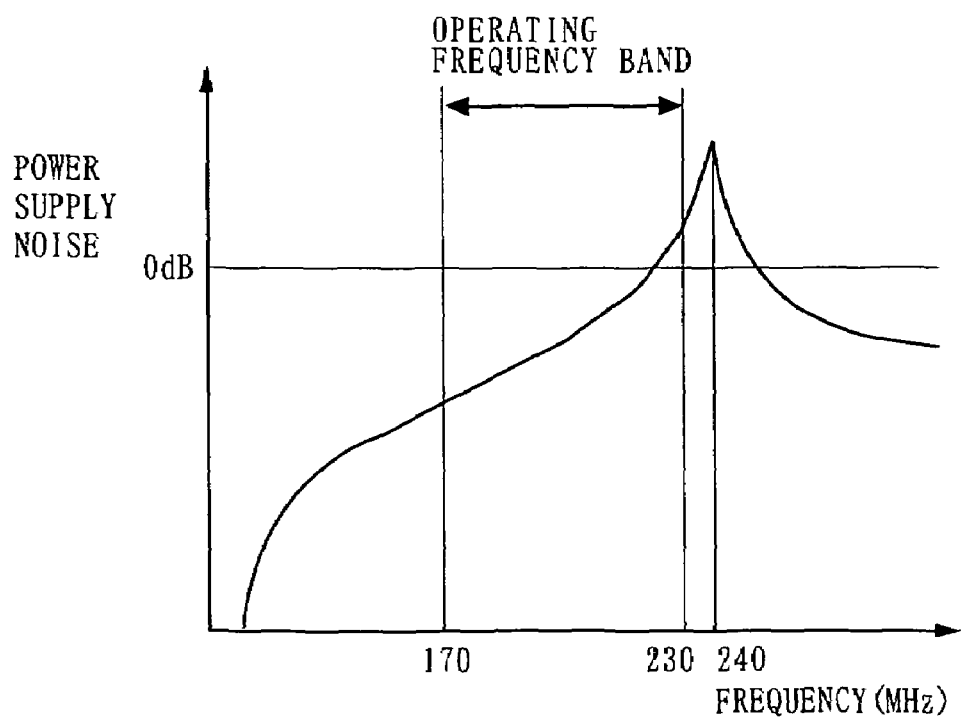
FIG. 7 is a graph showing a frequency characteristic in the case where the resonance frequency is shifted to a frequency higher than the operating frequency band in the apparatus as shown in FIG. 1.

FIG. 7 is a graph showing a frequency characteristic in the case where the resonance frequency is shifted to a frequency higher than the operating frequency band. Such a shift of the resonance frequency is performed in the case where the resonance frequency is included in the operating frequency band. In the frequency characteristic as shown in FIG. 7, the resonance frequency is 240 MHz, which is higher than the operating frequency band (170 MHz to 230 MHz). In order to shift the resonance frequency from 190 MHz to 240 MHz, the power supply wire inductance and/or the power supply wire capacitance should be reduced. For example, only the power supply wire inductance may be reduced from 5 nH to 3 nH, or only the power supply wire capacitance may be reduced from 20 nF to 10 nF. Alternatively, the power supply wire inductance and the power supply wire capacitance may be reduced from 5 nH to 4 nH and from 20 nF to 15 nF, respectively. As described above, by making a particular modification to a component element of the target circuit, it is possible to shift the resonance frequency to 240 MHz, which is higher than the operating frequency band. As a result, it is possible to suppress power supply noise in the operating frequency band to less than a predetermined level.

Figure 8A:
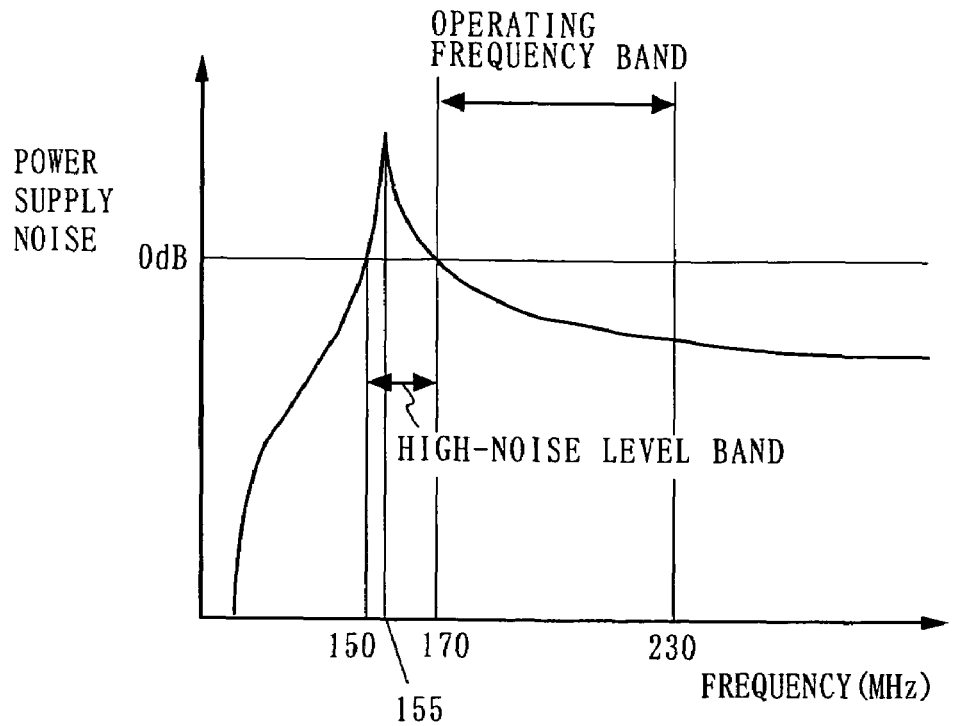
FIGS. 8A and 8B are graphs each showing a frequency characteristic in the case where a high noise level band is shifted to a frequency band which does not overlap the operating frequency band in the apparatus as shown in FIG. 1.
Figure 8B:
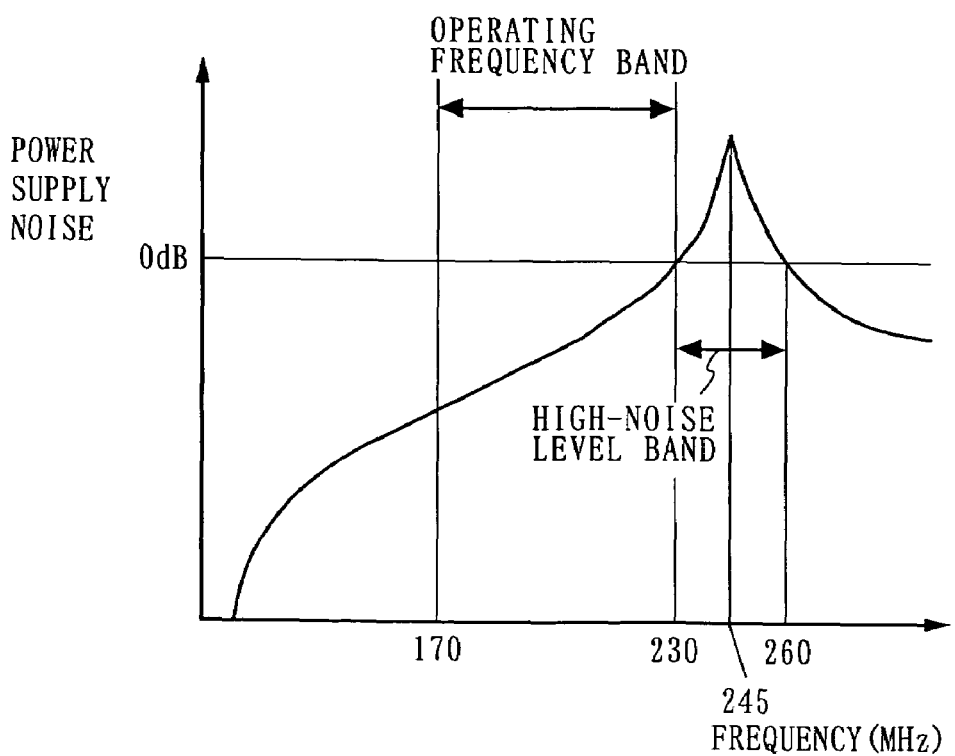

FIGS. 8A and 8B are graphs each showing a frequency characteristic in the case where the high-noise level band is shifted to a frequency band which does not overlap the operating frequency band. Such a shift of the high-noise level band is performed in the case where the operating frequency band overlaps the high-noise level band. In the frequency characteristic as shown in FIG. 8A, the high-noise level band is from 150 MHz to 170 MHz, which does not overlap the operating frequency band (170 MHz to 230 MHz). As is the case where the resonance frequency is shifted to a frequency lower than the operating frequency band (FIG. 6), in order to shift the high-noise level band to a frequency band from 150 MHz to 170 MHz, the power supply wire inductance and/or the power supply wire capacitance should be increased. In the frequency characteristic as shown in FIG. 8B, the high-noise level band is from 230 MHz to 260 MHz, which does not overlap the operating frequency band (170 MHz to 230 MHz). As is the case where the resonance frequency is shifted to a frequency higher than the operating frequency band (FIG. 7), in order to shift the high-noise level band to a frequency band from 230 MHz to 260 MHz, the power supply wire inductance and/or the power supply wire capacitance should be reduced.

In order to shift the high-noise level band to a frequency band which does not overlap the operating frequency band (as shown in FIGS. 8A and 8B), it is necessary to cause an inductance component, a capacitance component, and a resistance component, which are included in the impedance of the power supply wire, to change more drastically than when the resonance frequency is shifted out of the operating frequency band (as shown in FIG. 6 and FIG. 7). However, by shifting the high-noise level band to a frequency band which does not overlap the operating frequency band, power supply noise can be suppressed in a more effective manner.

Note that in the case where the semiconductor integrated circuit has a plurality of operating frequencies or includes an asynchronous circuit, instead of the above-described operating frequency band, another frequency band previously determined for the semiconductor integrated circuit may be used. For example, instead of the above-described operating frequency band, a frequency band determined based on a consumption current of the semiconductor integrated circuit may be used. Specifically, a consumption current of the semiconductor integrated circuit is obtained by performing current simulation, and the obtained current is expanded into a frequency component using the Fourier expansion, for example, so as to use a frequency band around a frequency at which the above frequency component is maximized. Alternatively, instead of the above-described operating frequency band, a frequency band determined based on a voltage drop value of the semiconductor integrated circuit may be used. Specifically, a voltage drop of the semiconductor integrated circuit is obtained by performing voltage drop simulation, and the obtained voltage is expanded into a frequency component using the Fourier expansion, for example, so as to use a frequency band around a frequency at which the above frequency component is maximized.

Hereinafter, with reference to FIGS. 9 toll, an operation of the design modification section 13 will be described. The design modification section 13 performs at least one processing appropriately selected from the group consisting of inductance adjustment processing (FIG. 9), capacitance adjustment processing (FIG. 10), and resistance adjustment processing (FIG. 11), which will be described below.

Figure 9:
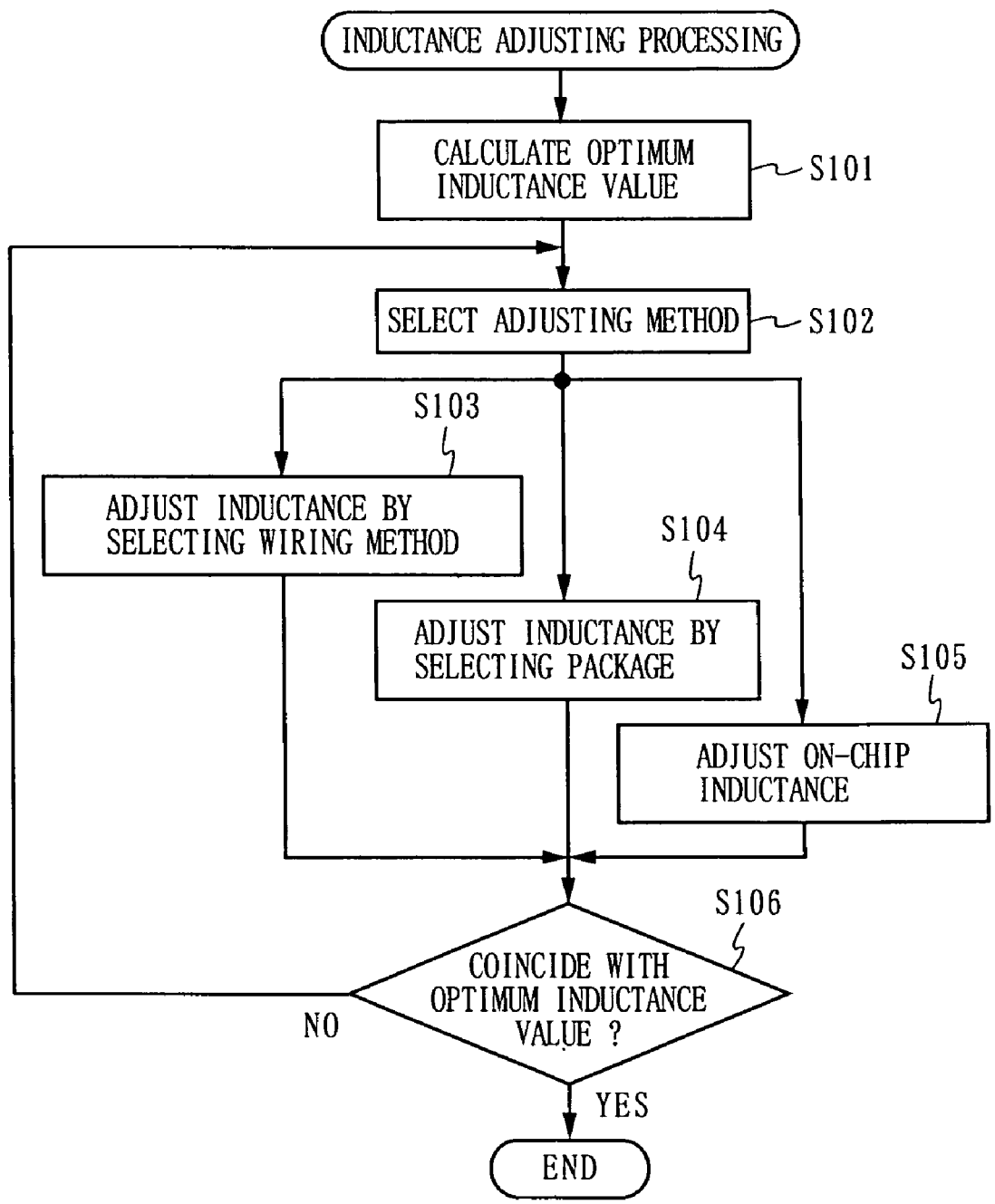
FIG. 9 is a flowchart showing inductance adjustment processing performed by a design modification section of the apparatus as shown in FIG. 1.

FIG. 9 is a flowchart showing inductance adjustment processing performed by the design modification section 13. In the inductance adjustment processing, the design modification section 13 first calculates an optimum inductance value based on the power supply noise frequency characteristic information 26 and the operating frequency information 27 (step S101). More specifically, the design modification section 13 selects whether the resonance frequency should be shifted to a lower frequency or a higher frequency based on the power supply noise frequency characteristic information 26 and the operating frequency information 27, and calculates a target value for an inductance component included in the impedance of the power supply wire of the target circuit in accordance with the selection result. At this time, a direction in which the resonance frequency is shifted may be selected automatically by the design modification section 13, or may be set by a user.

Next, the design modification section 13 selects processing to be performed next from among steps S103 to S105 in accordance with a predetermined order of priority (step S102). The order of priority may be automatically selected by the design modification section 13, or may be set by the user. In accordance with the selection result at step S102, the design modification section 13 proceeds to any of steps S103, S104, and S105.

In the case where the design modification section 13 proceeds to step S103, the design modification section 13 adjusts an inductance by selecting a wiring method. The design data 21 includes information indicating a wiring method for the target circuit (a wiring method used when a chip is connected to a package). At step S103, the design modification section 13 changes a wiring method used for the target circuit in order to bring an inductance component included in the impedance of the power supply wire closer to the optimum value calculated at step S101. For example, the design modification section 13 changes a normal wiring method to a double wiring method or a wiring method utilizing a dummy pad. The above-described inductance adjustment processing performed by selecting a wiring method is effective when a high degree of integration on a chip makes it difficult to insert additional inductance element, or when a type of package is previously determined due to size reduction of the semiconductor integrated circuit, for example. Note that, at step S103, the design modification section 13 may change the number of pads or separation of power supplies used when a chip is connected to a package.

In the case where the design modification section 13 proceeds to step S104, the design modification section 13 adjusts an inductance by selecting a package. The design data 21 includes information indicating a type of package used in the target circuit. At step S104, the design modification section 13 changes a type of package of the target circuit in order to bring an inductance component included in the impedance of the power supply wire closer to the optimum value calculated at step S101. The above-described inductance adjustment processing performed by selecting a package is effective when a high degree of integration on a chip makes it difficult to insert additional inductance element, or when a limited number of pads makes it difficult to adjust an inductance by selecting a wiring method, for example.

In the case where the design modification section 13 proceeds to step S105, the design modification section 13 adjusts an on-chip inductance. The design data 21 includes layout information of the power supply wire of the target circuit. At step S105, in order to bring an inductance component included in the impedance of the power supply wire closer to the optimum value calculated at step S101, the design modification section 13 provides an additional inductance element to the path including the power supply wire using a pattern generator, etc., or changes characteristics of the existing inductance element. The above-described on-chip inductance adjustment processing is effective when a limited number of pads makes it difficult to adjust an inductance by selecting a wiring method, or when a type of package is previously determined due to size reduction of the semiconductor integrated circuit, for example.

After any of steps S103, S104, and S105 is performed, the design modification section 13 determines whether or not an inductance component included in the impedance of the power supply wire of the target circuit whose inductance has been adjusted coincides with the optimum value calculated at step S101 (step S106). In the case where the determination result is negative, the design modification section 13 proceeds to step S102, selects processing that has not yet been performed from among steps S103 to S105, and performs the selected process. On the other hand, in the case where the determination result is affirmative, the design modification section 13 ends the inductance adjustment processing.

Figure 10:
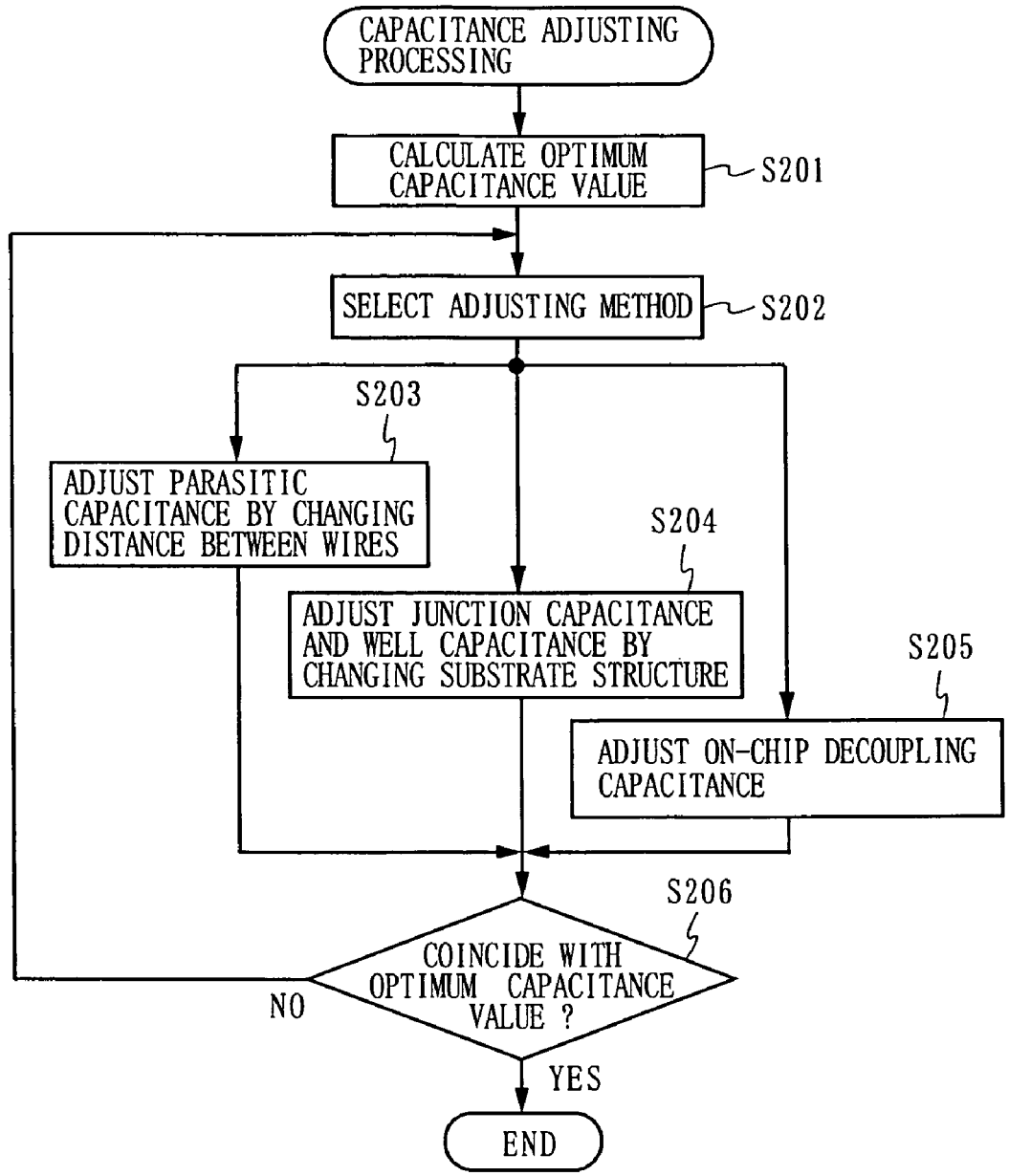
FIG. 10 is a flowchart showing capacitance adjustment processing performed by the design modification section of the apparatus as shown in FIG. 1.

FIG. 10 is a flowchart showing a capacitance adjustment processing performed by the design modification section 13. In the capacitance adjustment processing, the design modification section 13 first calculates an optimum capacitance value based on the power supply noise frequency characteristic information 26 and the operating frequency information 27 (step S201). Next, the design modification section 13 selects processing to be performed next from among steps S203 to S205 in accordance with a predetermined order of priority (step S202). The details of steps S201 and S202 are identical to those of steps S101 and S102 in the inductance adjustment processing (FIG. 9). In accordance with the selection result at step S202, the design modification section 13 proceeds to any of steps S203, S204, and S205.

In the case where the design modification section 13 proceeds to step S203, the design modification section 13 adjusts a parasitic capacitance by changing a distance between wires. The design data 21 includes layout information of the power supply wire of the target circuit. At step S203, the design modification section 13 changes a distance between power supply wires in order to bring a capacitance component included in the impedance of the power supply wire closer to the optimum value calculated at step S201. If the distance between power supply wires is changed, a parasitic capacitance between the wires changes, so that a capacitance value of the power supply wire changes. The above-described parasitic capacitance adjustment processing performed by changing a distance between wires only requires changing data used in a wiring process.

In the case where the design modification section 13 proceeds to step S204, the design modification section 13 adjusts a junction capacitance and a well capacitance by changing a substrate structure. The design data 21 includes layout information and process information of the power supply wire of the target circuit. At step S204, the design modification section 13 changes a capacitance component in series with the path including the power supply wire in order to bring a capacitance component included in the impedance of the power supply wire closer to the optimum value calculated at step S201. Alternatively, the design modification section 13 may change the amount of impurities to be added when a well is formed. As such, processing for adjusting a junction capacitance and a well capacitance by changing a substrate structure can be performed by changing layout information or by changing only data used in a process.

In the case where the design modification section 13 proceeds to step S205, the design modification section 13 adjusts an on-chip decoupling capacitance. The design data 21 includes layout information of the power supply wire of the target circuit. At step S205, in order to bring a capacitance component included in the impedance of the power supply wire closer to the optimum value calculated at step S201, the design modification section 13 provides an additional capacitive element to the path including the power supply wire using a pattern generator, etc., or changes characteristics of the existing capacitive element. The above-described on-chip decoupling capacitance adjustment processing is characterized in that a capacitance can be inserted in a small and effective area.

After any of steps S203, S204, and S205 is performed, the design modification section 13 determines whether or not a capacitance component included in the impedance of the power supply wire of the target circuit whose capacitance has been adjusted coincides with the optimum value calculated at step S201 (step S206). In the case where the determination result is negative, the design modification section 13 proceeds to step S202, selects processing that has not yet been performed from among steps S203 to S205, and performs the selected process. On the other hand, in the case where the determination result is affirmative, the design modification section 13 ends the capacitance adjustment processing.

Figure 11:
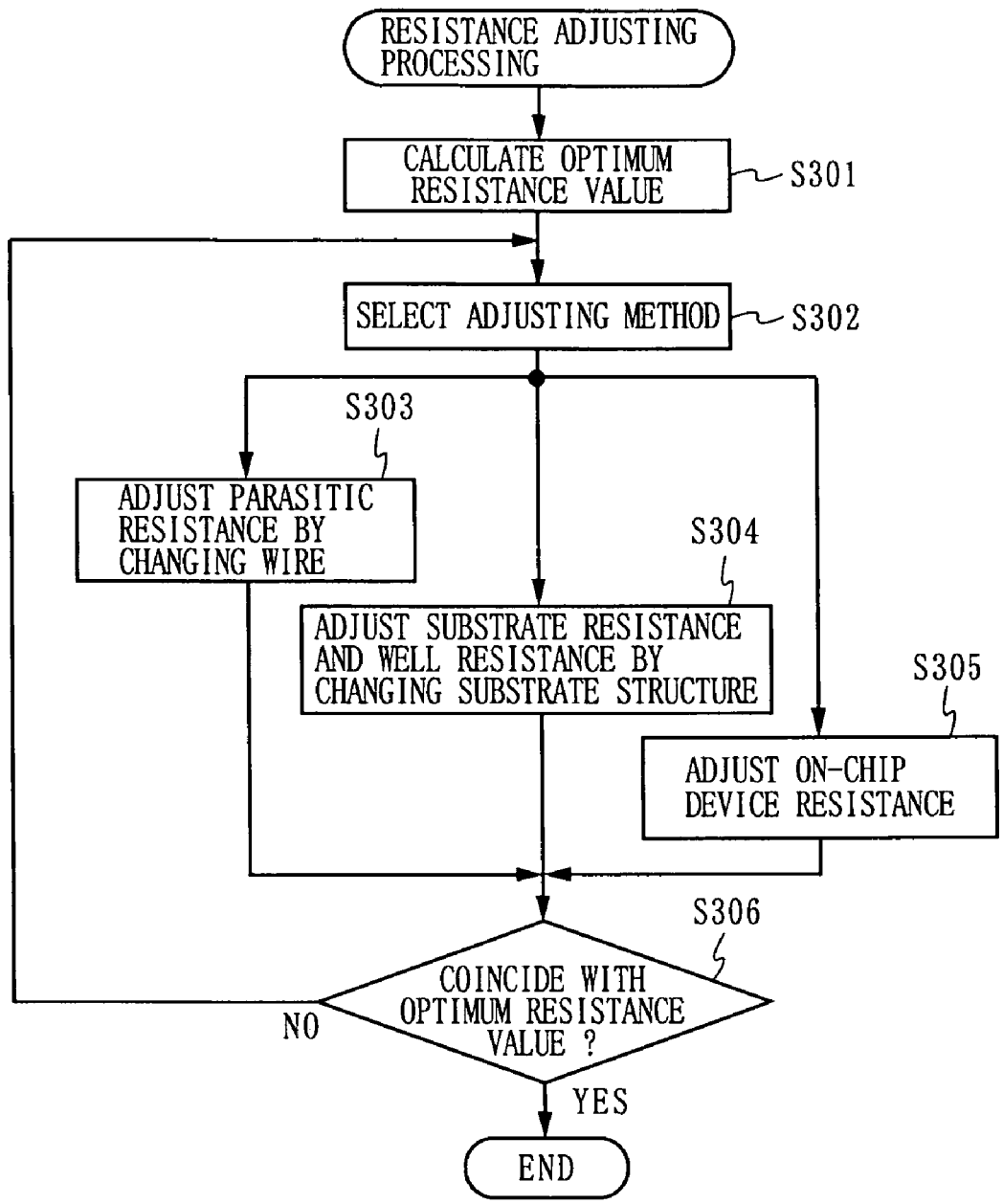
FIG. 11 is a flowchart showing resistance adjustment processing performed by the design modification section of the apparatus as shown in FIG. 1.
Figure 12A:
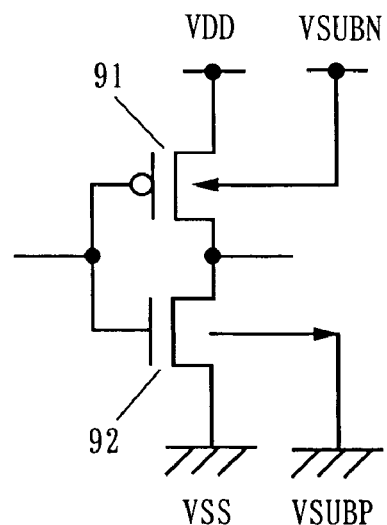
FIGS. 12A and 12B are diagrams each showing the structure of a CMOS inverter in which a substrate voltage is controlled by an additional power supply.
Figure 12B:
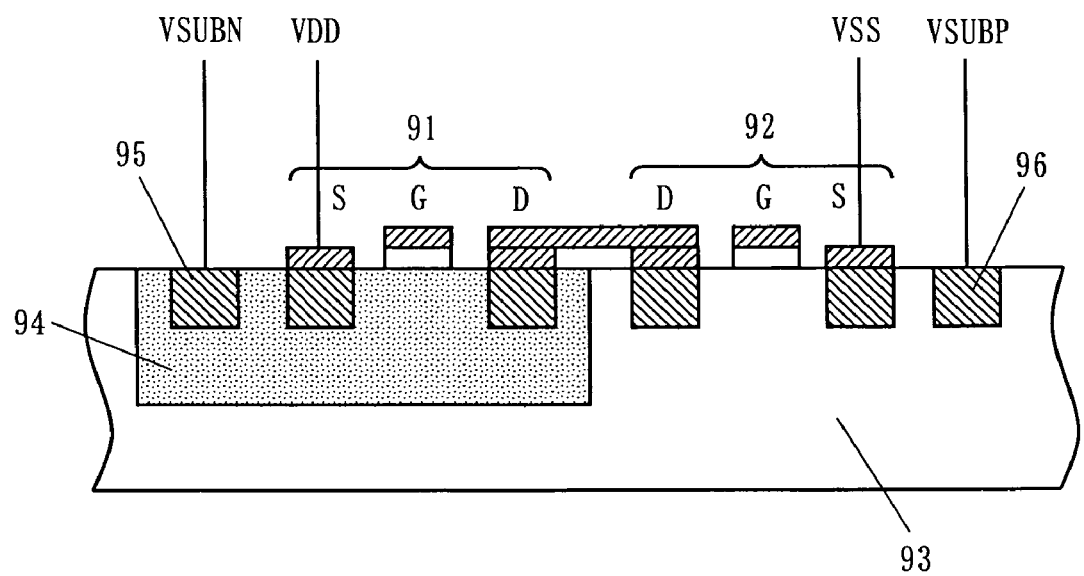
Figure 13A:
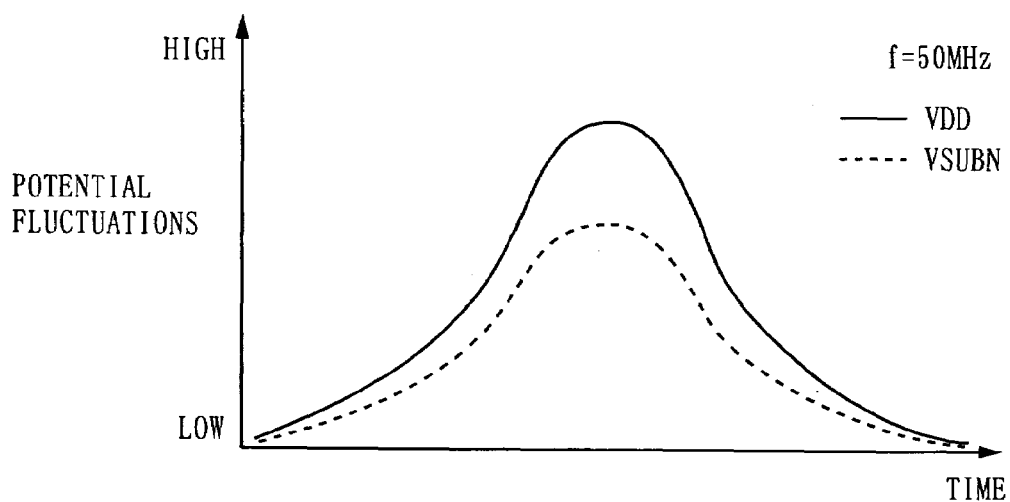
FIGS. 13A to 13C are graphs each showing power supply noise of a semiconductor integrated circuit whose substrate voltage is controlled by an additional power supply.
Figure 13B:
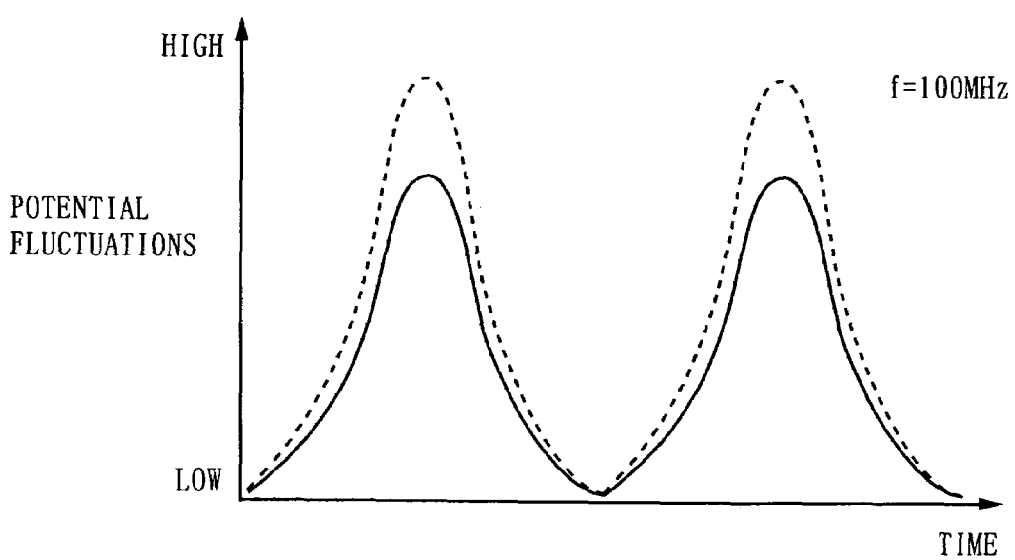
Figure 13C:
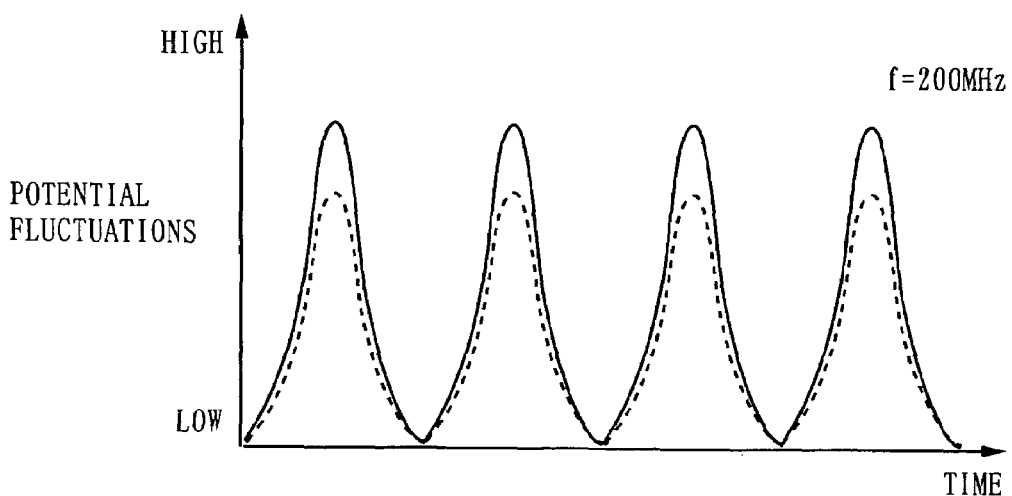

FIG. 11 is a flowchart showing resistance adjustment processing performed by the design modification section 13. In the resistance adjustment processing, the design modification section 13 first calculates an optimum resistance value based on the power supply noise frequency characteristic information 26 and the operating frequency information 27 (step S301). Next, the design modification section 13 selects processing to be performed next from among steps S303 to S305 in accordance with a predetermined order of priority (step S302). The details of steps S301 and S302 are identical to those of steps S101 and S102 in the inductance adjustment processing (FIG. 9). In accordance with the selection result at step S302, the design modification section 13 proceeds to any of steps S303, S304, and S305.

In the case where the design modification section 13 proceeds to step S303, the design modification section 13 adjusts a parasitic resistance by changing a wire. The design data 21 includes layout information of the power supply wire of the target circuit. At step S303, the design modification section 13 changes a length and a width of the power supply wire in order to bring a resistance component included in the impedance of the power supply wire closer to the optimum value calculated at step S301. If a length and width of the power supply wire is changed, a parasitic resistance of the wire changes, so that a resistance value of the power supply wire changes. The above-described processing for adjusting a parasitic resistance by changing a wire can be performed by changing only data used in a wiring process.

In the case where the design modification section 13 proceeds to step S304, the design modification section 13 adjusts a substrate resistance and a well resistance by changing a substrate structure. The design data 21 includes layout information of the power supply wire of the target circuit. At step S304, the design modification section 13 changes a resistance component in series with the path including the power supply wire in order to bring a resistance component included in the impedance of the power supply wire closer to the optimum value calculated at step S301. Alternatively, the design modification section 13 may change the amount of impurities to be added when a well is formed. As such, processing for adjusting a substrate capacitance and a well capacitance by changing a substrate structure can be performed by changing layout information or by changing only data used in a process.

In the case where the design modification section 13 proceeds to step S305, the design modification section 13 adjusts an on-chip device resistance. The design data 21 includes layout information of the power supply wire of the target circuit. At step S305, in order to bring a resistance component included in the impedance of the power supply wire closer to the optimum value calculated at step S301, the design modification section 13 provides an additional resistance element to the path including the power supply wire using a pattern generator, etc., or changes characteristics of the existing resistance element. The above-described on-chip device resistance adjustment processing is characterized in that a resistance can be inserted in a small and effective area.

After any of steps S303, S304, and S305 is performed, the design modification section 13 determines whether or not a resistance component included in the impedance of the power supply wire of the target circuit whose resistance has been adjusted coincides with the optimum resistance value calculated at step S301 (step S306). In the case where the determination result is negative, the design modification section 13 proceeds to step S302, selects processing that has not yet been performed from among steps S303 to S305, and performs the selected process. On the other hand, in the case where the determination result is affirmative, the design modification section 13 ends the resistance adjustment processing.

The design modification section 13 changes the design data 21 to the modified design data 28 by appropriately selecting and performing the inductance adjustment processing, the capacitance adjustment processing, and the resistance adjustment processing. In the semiconductor integrated circuit manufactured in accordance with the resultant modified design data 28, power supply noise is lower than that of the semiconductor integrated circuit manufactured in accordance with the design data 21. Thus, according to the design apparatus 10 as shown in FIG. 1, it is possible to design a semiconductor integrated circuit suppressing power supply noise.

Here, the third circuit model (FIG. 4) used for calculating an impedance between a plurality of power supplies will be described. In the third circuit model as shown in FIG. 4, a power supply VDD and an N-well power supply VSUBN are controlled by separate power supplies that are the same in potential. In this circuit, by controlling the N-well power supply VSUBN so that there is a potential difference between a point P and a point Q, it is possible to control a transistor threshold voltage Vth and achieve high-speed operation and low power consumption (low gate leakage current) of the circuit.

The circuit model as shown in FIG. 4 includes a first wire for supplying a power supply VDD, a second wire for supplying a ground VSS, and a third wire for supplying an N-well power supply VSUBN, and includes a first path including the first and second wires, a second path including the first and third wires, and a third path including the second and third wires. A potential at a point P depends on a noise characteristic determined by the impedance of the first and second paths. Also, a potential at a point Q depends on a noise characteristic determined by the impedance of the second and third paths.

Thus, in order to prevent a substrate potential from being affected by power supply noise, a design modification should be made to the target circuit so that a frequency characteristic of power supply noise at a point P coincides with a frequency characteristic of power supply noise at a point Q.

On the other hand, a design modification may be made to the target circuit so that a frequency characteristic of power supply noise at a point P is shifted from a frequency characteristic of power supply noise at a point Q. Such a design modification enables reduction of a leakage current of a circuit at a particular frequency band by increasing a transistor threshold voltage Vth and high-speed operation of the circuit at another frequency band by reducing the transistor threshold voltage Vth.

Also, the amount of fluctuations of a transistor characteristic due to a potential difference between two terminals of the transistor may be previously calculated, and a difference between a noise amplification ratio of power supply noise at a point P and a noise amplification ratio of power supply noise at a point Q (i.e., potential difference) may be obtained at each frequency in the operating frequency band to decide whether or not the amount of fluctuations of a transistor characteristic is equal to or smaller than a predetermined threshold value when there is a difference between the noise amplification ratios. Based on the above decision result, a determination as to whether or not to make a design modification to the target circuit may be made.

As described above, based on the design method according to the present embodiment, it is possible to design a semiconductor integrated circuit suppressing power supply noise by making a design modification by taking into account a frequency characteristic of power supply noise. Also, the design method according to the present embodiment can be performed at an early stage after floor planning or layout process, whereby it is possible to select an optimum design modification from among various design modifications that are selectable at that stage, and perform the selected design modification.

According to the design method of the present invention, it is possible to design a semiconductor integrated circuit suppressing power supply noise by taking into account a frequency characteristic of power supply noise. Thus, the design method of the present invention can be utilized in designing various semiconductor integrated circuits.

While the invention has been described in detail, the foregoing description is in all aspects illustrative and not restrictive. It is understood that numerous other modifications and variations can be devised without departing from the scope of the invention.

What is claimed is:

1. A design method for designing a semiconductor integrated circuit suppressing power supply noise, comprising the steps of:
calculating an impedance of power supply wires based on design data of the semiconductor integrated circuit;
analyzing the calculated impedance to obtain a frequency characteristic of power supply noise; and
modifying a design of the semiconductor integrated circuit based on the obtained frequency characteristic;
wherein an impedance calculating step calculates the impedance of a path including two or more power supply wires separated by a diffusion capacitance and/or a well capacitance.

2. The design method according to claim 1, wherein the impedance calculating step calculates an impedance of a path including two or more power supply wires such that different potentials are applied thereto.

3. The design method according to claim 1, wherein the impedance calculating step calculates an impedance of a path including two or more power supply wires such that a same potential is applied thereto.

4. The design method according to claim 1, wherein the impedance calculating step calculates an impedance including an impedance of a package connected to two or more power supply wires.

5. The design method according to claim 1, wherein the impedance calculating step calculates an impedance including an impedance of a printed circuit board connected to two or more power supply wires.

6. The design method according to claim 1, wherein the design modification step changes any of a wiring method used for connecting a chip to a package, a number of pads, and separation of power supplies of the power supply wire of the semiconductor integrated circuit.

7. The design method according to claim 1, wherein the design modification step changes a type of package of the semiconductor integrated circuit.

8. The design method according to claim 1, wherein the design modification step performs at least one or both of processing for providing an additional inductance element to the path including two or more power supply wires, and processing for changing a characteristic of an inductance element existing on the path including two or more power supply wires.

9. The design method according to claim 1, wherein the design modification step changes a substrate structure of the semiconductor integrated circuit.

10. The design method according to claim 1, wherein the design modification step changes a distance between two or more power supply wires.

11. The design method according to claim 1, wherein the design modification step performs at least one or both of processing for providing an additional decoupling capacitance between the power supply wires and processing for changing a characteristic of a decoupling capacitance existing between the power supply wires.

12. The design method according to claim 1, wherein the design modification step changes at least one or both of a length and a width of a power supply wire of the semiconductor integrated circuit.

13. The design method according to claim 1, wherein the design modification step performs at least one or both of processing for providing an additional resistance element to a path including two and more power supply wires or processing for changing a characteristic of a resistance element existing on the path including two or more power supply wires.

14. The design method according to claim 1, wherein the design modification step changes a design of the semiconductor integrated circuit based on the obtained frequency characteristic and a predetermined frequency band of the semiconductor integrated circuit.

15. The design method according to claim 14, wherein the design modification step changes a design of the semiconductor integrated circuit in a case where a frequency at which power supply noise is maximized is included in the frequency band.

16. The design method according to claim 14, wherein the design modification step changes a design of the semiconductor integrated circuit in a case where a frequency band at which power supply noise is equal to or greater than a predetermined value overlaps the frequency band.

17. The design method according to claim 14, wherein the frequency band is an operating frequency band of the semiconductor integrated circuit.

18. The design method according to claim 14, wherein the frequency band is determined based on a frequency characteristic of a consumption current of the semiconductor integrated circuit.

19. The design method according to claim 14, wherein the frequency band is determined based on a frequency characteristic of a voltage drop value of the semiconductor integrated circuit.

20. The design method according to claim 1, wherein
the impedance calculating step calculates a plurality of impedances of a path including two or more power supply wires,
the analyzing step analyzes the plurality of calculated impedances to obtain a plurality of frequency characteristics of power supply noise, and
the design modification step changes a design of the semiconductor integrated circuit based on the plurality of calculated frequency characteristics.

21. The design method according to claim 20, wherein the design modification step changes a design of the semiconductor integrated circuit such that the plurality of calculated frequency characteristics coincide with each other.

22. The design method according to claim 20, wherein the design modification step changes a design of the semiconductor integrated circuit such that the plurality of calculated frequency characteristics are shifted from each other.

* * * * *